United States Patent
Cohen

(10) Patent No.: US 10,251,226 B2
(45) Date of Patent: Apr. 2, 2019

(54) METHOD AND APPARATUS FOR CALCULATING AN AVERAGE VALUE OF AN INACCESSIBLE CURRENT FROM AN ACCESSIBLE CURRENT

(71) Applicant: Texas Instruments Incorporated, Dallas, TX (US)

(72) Inventor: Isaac Cohen, Dix Hills, NY (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 15/455,484

(22) Filed: Mar. 10, 2017

(65) Prior Publication Data

US 2017/0188425 A1    Jun. 29, 2017

Related U.S. Application Data

(62) Division of application No. 14/455,545, filed on Aug. 8, 2014, now Pat. No. 9,596,724.

(Continued)

(51) Int. Cl.
*H05B 33/08* (2006.01)
*H02M 3/158* (2006.01)
(Continued)

(52) U.S. Cl.
CPC ....... *H05B 33/0815* (2013.01); *G01R 19/003* (2013.01); *G01R 19/0038* (2013.01);
(Continued)

(58) Field of Classification Search
None
See application file for complete search history.

(56) References Cited

U.S. PATENT DOCUMENTS 5,457,620 A    10/1995   Dromgoole
5,627,740 A    5/1997    Johari
(Continued)

FOREIGN PATENT DOCUMENTS

CN    101677206 A    3/2010
CN    102056363 A    5/2011
(Continued)

OTHER PUBLICATIONS

Search Report for Chinese Application No. CN 201480045743.9, dated Sep. 13, 2016 (3 pages).
(Continued)

*Primary Examiner* — Dedei K Hammond
(74) *Attorney, Agent, or Firm* — Tuenlap Chan; Charles A. Brill; Frank D. Cimino

(57) ABSTRACT

In a power converter, a circuit determines an average value of an inaccessible current from an average value of an accessible current and a value of the operating duty cycle of the converter. A method of measuring an average value of an inaccessible current from a measured value of a current, in a power converter, by a duty cycle of a pulse width modulation (PWM) signal, representing a duty cycle of the power converter. Coupling a voltage representing the measured value to an input of a low pass filter during a time period (D) and coupling the input of the low pass filter to a reference voltage during a time period (1−D).

5 Claims, 11 Drawing Sheets

Related U.S. Application Data

(60) Provisional application No. 61/870,590, filed on Aug. 27, 2013, provisional application No. 61/919,416, filed on Dec. 20, 2013.

(51) Int. Cl.
   *H02M 3/335* (2006.01)
   *G01R 19/00* (2006.01)
   *H02M 3/156* (2006.01)
   *H02M 1/088* (2006.01)
   *H02M 1/08* (2006.01)
   *H02M 1/00* (2006.01)

(52) U.S. Cl.
   CPC .......... *H02M 1/08* (2013.01); *H02M 1/088* (2013.01); *H02M 3/156* (2013.01); *H02M 3/1582* (2013.01); *H02M 3/33507* (2013.01); *H05B 33/083* (2013.01); *H05B 33/0845* (2013.01); *H02M 3/33546* (2013.01); *H02M 2001/0006* (2013.01); *H02M 2001/0009* (2013.01)

(56) References Cited

U.S. PATENT DOCUMENTS

| | | | |
|---|---|---|---|
| 5,867,379 A | 2/1999 | Maksimovic et al. | |
| 5,903,449 A | 5/1999 | Garrigan et al. | |
| 5,912,552 A | 6/1999 | Tateishi | |
| 6,064,187 A | 5/2000 | Redl | |
| 6,191,564 B1 | 2/2001 | Mao | |
| 6,246,215 B1 | 6/2001 | Popescu-Stanesti | |
| 6,285,139 B1* | 9/2001 | Ghanem | G01R 31/2653 307/60 |
| 6,469,491 B1 | 10/2002 | Schultz | |
| 6,806,694 B2 | 10/2004 | Rupp et al. | |
| 6,960,904 B2 | 11/2005 | Matsuura et al. | |
| 7,088,598 B2 | 8/2006 | Yang et al. | |
| 7,254,044 B2 | 8/2007 | Perry et al. | |
| 7,279,868 B2 | 10/2007 | Lanni | |
| 7,615,981 B2 | 11/2009 | Wong et al. | |
| 7,642,762 B2 | 1/2010 | Xie et al. | |
| 7,663,352 B2 | 2/2010 | Yang et al. | |
| 7,795,846 B2 | 9/2010 | Martin | |
| 7,868,603 B2 | 1/2011 | Lacombe et al. | |
| 7,906,941 B2 | 3/2011 | Jayaraman et al. | |
| 7,923,973 B2 | 4/2011 | Odell | |
| 8,024,138 B2 | 9/2011 | Carroll et al. | |
| 8,054,056 B2 | 11/2011 | Coleman | |
| 8,098,506 B2 | 1/2012 | Saint-Pierre | |
| 8,242,762 B2 | 8/2012 | Bhagwat et al. | |
| 8,525,499 B2* | 9/2013 | Minami | H02M 3/156 323/282 |
| 8,587,967 B2 | 11/2013 | Cohen | |
| 8,659,273 B2 | 2/2014 | McDonald et al. | |
| 8,680,820 B2 | 3/2014 | Harrison | |
| 8,742,738 B2 | 6/2014 | Houston | |
| 8,866,455 B2 | 10/2014 | Jeong et al. | |
| 8,941,366 B2 | 1/2015 | Halsted | |
| 2004/0188717 A1 | 9/2004 | Ono | |
| 2005/0219870 A1 | 10/2005 | Yang et al. | |
| 2005/0275392 A1 | 12/2005 | Wong et al. | |
| 2006/0097705 A1* | 5/2006 | Cheung | H02M 3/156 323/222 |
| 2007/0008756 A1 | 1/2007 | Djenguerian et al. | |
| 2008/0197817 A1 | 8/2008 | Colbeck et al. | |
| 2009/0179619 A1 | 7/2009 | Houston | |
| 2010/0308733 A1 | 12/2010 | Shao | |
| 2011/0001360 A1 | 1/2011 | Rua' et al. | |
| 2011/0182088 A1 | 7/2011 | Lidak et al. | |
| 2011/0309811 A1 | 12/2011 | Kondo et al. | |
| 2012/0153920 A1 | 6/2012 | Guenther et al. | |
| 2012/0169245 A1 | 7/2012 | Chen | |
| 2012/0200229 A1 | 8/2012 | Kunst et al. | |
| 2013/0049623 A1 | 2/2013 | Murakami | |
| 2013/0307512 A1 | 11/2013 | Guenther et al. | |
| 2014/0239810 A1* | 8/2014 | Martin-Lopez | H05B 37/02 315/85 |
| 2015/0061614 A1 | 3/2015 | Cohan | |
| 2015/0137785 A1 | 5/2015 | Stevens | |
| 2016/0143104 A1* | 5/2016 | Chen | H05B 33/0815 315/200 R |

FOREIGN PATENT DOCUMENTS

| | | |
|---|---|---|
| CN | 102438349 A | 5/2012 |
| CN | 102497699 A | 6/2012 |
| CN | 102958244 A | 3/2013 |
| JP | 2011155725 A | 8/2011 |
| RU | 128433 U1 | 5/2013 |

OTHER PUBLICATIONS

CN102958244A, English Machine Translation (12 pages).
CN101677206A, English Machine Translation (17 pages).
CN102056363A, English Machine Translation (12 pages).
CN102497699A, English Machine Translation (12 pages).
CN102438349A, English Machine Translation (44 pages).
Search Report for EP14840388.8, dated Jul. 28, 2017 (1 page).
PCT/US2014/053004 Search Report, dated Dec. 4, 2014 (1 page).
RU128433U1, English Machine Translation (5 pages).
R. Victor Jones, "Op Amp Filter Circuits," Electronic Devices and Circuits, Engineering Sciences 154, URL http://people.seas.harvard.edu/~jones/es154/lectures/lecture_1/filters/filters.html, Oct. 5, 2001, pp. 1-7.
Non-Final Office Action for U.S. Appl. No. 13/532,492 (now U.S. Pat. No. 8,941,366), dated Apr. 10, 2014 (10 pages).
Notice of Allowance With References for U.S. Appl. No. 13/532,492 (now U.S. Pat. No. 8,941,366), dated Aug. 27, 2014 (10 pages).
Non-Final Office Action for U.S. Appl. No. 14/455,582 (publication No. 20150061522), dated Jan. 15, 2016 (14 pages).
ST Microelectronics, "L6562, Transition-Mode PFC Controller," Nov. 2005, Rev. 8, pp. 1-16.
JP First Office Action-Translation, dated Jun. 13, 2018, 6 pages.
First Office Action JP 2016-537827, dated Jun. 5, 2018, 4 pages.

* cited by examiner

METHOD AND APPARATUS FOR CALCULATING AN AVERAGE VALUE OF AN INACCESSIBLE CURRENT FROM AN ACCESSIBLE CURRENT

CROSS-REFERENCE TO RELATED APPLICATIONS

This patent application is a divisional of U.S. Nonprovisional patent application Ser. No. 14/455,545, filed Aug. 8, 2014, U.S. Pat. No. 9,596,724, which claims priority from U.S. Provisional Application No. 61/870,590 filed on Aug. 27, 2013 and from U.S. Provisional Application 61/919,416 filed on Dec. 20, 2013, which are incorporated herein by reference in their entirety for all purposes. This patent application is related to U.S. application Ser. No. 14/455,582 (TI-74128) filed on even date and U.S. application Ser. No. 14/455,607 (TI-75188) filed on even date, both of which are incorporated herein by reference in their entirety for all purposes.

FIELD

The invention relates to power converters and more specifically to power converters in which it is necessary to measure and/or control the converter utilizing an inaccessible current.

BACKGROUND

It may be necessary to measure a current within a power converter and/or control a power converter utilizing a measurement of a current which is inaccessible. As used herein, the term "inaccessible" includes, but is not limited to, a situation in which the power converter cannot access a measurement of a current within a load, because they are physically separate, for example. The load may not have means for measuring the desired current and it may not be possible to add such means or provide access to such measurement for a physically separate power converter. The term "inaccessible" is also intended to mean the situation in which the measurement of the current may be accessible, but the measurement may be difficult and/or expensive to make. For example, the result of the measurement, which may be a voltage, may be referred to a different ground or to a higher voltage, thus making a measuring or control circuit both difficult and/or expensive to make, in addition to being complex. Another possibility is that the current to be measured may be on the wrong side of the isolation barrier where it is undesirable to penetrate the barrier. Furthermore, the term "inaccessible" is intended to cover the situation in which the measurement of the current may be accessible and the cost and/or complexity of the circuit needed to make the measurement may be reasonable, but the measurement requires a high power dissipation. This can occur, for example, if a resistive shunt is used to measure the current in a high current power converter where producing a usable voltage across the shunt (e.g. 100 mV) may result in high power dissipation due to the high current passing through the shunt. Those skilled in the art will recognize that there are other situations in which the current desired to be measured and/or used to control a power converter may be "inaccessible".

It should be noted that although power converter circuits are sometimes called "regulators," the term "power converters" or "converters" as used herein should be considered as referring to a buck circuit, a boost circuit, or a buck-boost (flyback) circuit.

Thanks to the work of Vorperian and others who proposed a pulse width modulation (PWM) switch concept, there are known relationships between different average currents in the three types of converters, if the converter is operating in transition mode (TM) or continuous current mode (CCM). These relationships are:

Buck: $I_{sw}=I_{in}=I_{out}*D=I_{Diode}*D/(1-D)$        equation (1)

Boost: $I_{sw}=I_{in}*D=I_{out}*(1-D)/D=I_{Diode}*(1-D)/D$        equation (2)

Buck-Boost: $I_{sw}=I_{in}=I_{out}*(1-D)/D=I_{Diode}*D/(1-D)$        equation (3)

where $I_{SW}$ is the current in the switch;
$I_{IN}$ is the input current to the converter;
$I_{OUT}$ is the output current from the converter;
$I_{Diode}$ is the current in the rectifier diode or synchronous switch;
D is the duty cycle of the PWM switch; and
(1−D) is the duty cycle of the rectifier.

As can readily be seen by analysis of the equations, if the desired current to be measured or controlled is "inaccessible" (as defined herein), we can sense a more convenient current and then solve the appropriate equation from equations 1-3 to obtain a replica of the desired current which can then be used to provide the measurement and/or can be used as the control variable.

A problem with solving one of these equations is that it requires multiplication and/or division. As is well known to those skilled in the art, analog multiplication and division circuits are inaccurate, expensive, take up a lot of room on an integrated circuit and consume considerable power. On the other hand, utilizing digital circuits for this purpose requires an ADC circuit at the input and a DAC circuit at the output, if analog control is to be implemented. Thus, digital multiplication or division does not provide the desired solution, either.

Thus, there is a need for a simple, inexpensive, high-performance and reliable circuit to permit analog multiplication or division within a power converter to enable the use of inaccessible current measurement to provide a desired current for measurement and/or control in the power converter.

SUMMARY

It is a general object to provide analog multiplication or division within a power converter to enable the use of inaccessible current measurement to provide a desired current for measurement and/or control in the power converter.

In an aspect a buck converter having a regulated output current comprises a current measuring device measuring an input current to the converter. A switch is coupled to the current measuring device. A pulse width modulation (PWM) circuit is coupled to receive an output voltage from the measuring device. An analog multiplier is coupled to an output of the pulse width modulation (PWM) circuit to receive a signal (D) related to the duty cycle of the regulator and to a voltage representative of a predetermined value of output current from the converter.

In an aspect, a boost converter having a regulated average output current comprises a switch coupled to receive input current from the converter. A current measuring device measures the input current to the converter and generates a voltage representative thereof. A voltage represents a constant related to at which the output current is regulated to. A first analog multiplier is coupled to the voltage representing the constant multiplying the constant K by a signal representative of one minus the duty cycle of the converter (1−D) to generate a signal K*1(1−D). A second analog multiplier is coupled between the voltage representative of the input current and a first input to a pulse width modulation (PWM) circuit. A second input to the pulse width modulation (PWM) circuit being coupled to receive the signal K*1(1−D).

In an aspect, a buck voltage to current converter comprises a source AC input voltage. A switch is coupled to a load through an inductor. A current measuring device measures current through the switch. A current source is coupled to an analog multiplier for multiplying a current value by a duty cycle of the converter. A pulse width modulation (PWM) circuit receives a voltage output from the multiplier at one terminal thereof and receives a voltage related to the current measured by the current measuring device, the pulse width modulation (PWM) circuit generating a signal related to a duty cycle of the converter (D), wherein the switch is operated by the signal to generate a current through the load related to a constant times the input voltage.

In an aspect, a method for operating a dimmable LED comprises coupling an LED driver circuit to a rectified output of an AC dimmer. Providing a current related to an input voltage of the LED driver circuit. Multiplying the value of the current by the input voltage and a duty cycle of the LED driver to generate a first voltage. Comparing the first voltage with a voltage representative of current through a switch in the LED driver circuit to generate a comparison signal. Utilizing the comparison signal to generate a pulse width modulation (PWM) signal utilized to control the switch and the multiplication to drive the LED.

BRIEF DESCRIPTION OF THE DRAWINGS

Further aspects of the invention will appear from the appending claims and from the following detailed description given with reference to the appending drawings.

DETAILED DESCRIPTION OF EXAMPLE EMBODIMENTS

Those skilled in the art will recognize that, normally when a current is measured, a voltage analog of current is generated where the amplitude of the voltage is related to the amplitude of the current. Common methods of measuring current are to use a resistive shunt, a current transformer or a Hall effect device. The voltage generated by one of these devices can be used within the converter, in conjunction with one of the equations 1-3, to control the operation of the converter and/or provide the desired measurement.

Figure 1:
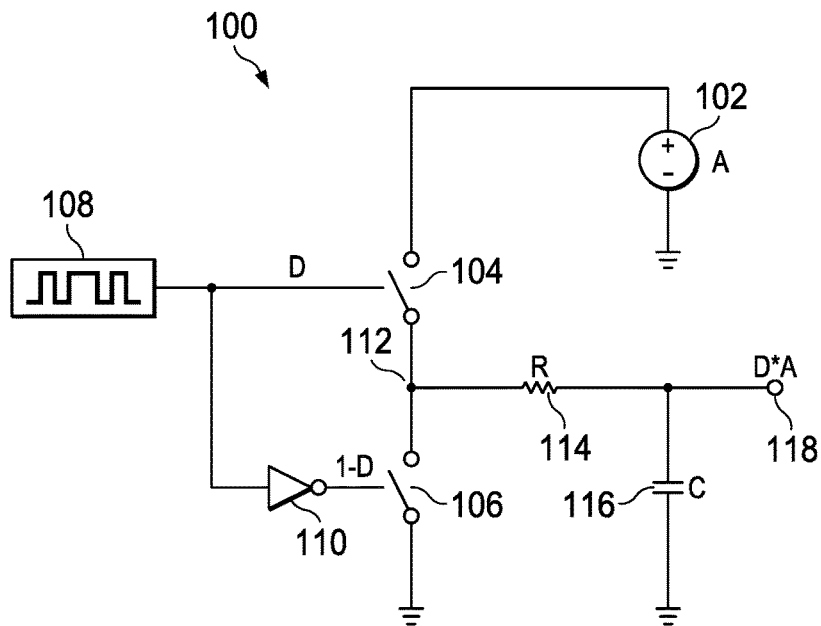
FIG. 1 is a schematic of an analog multiplier in accordance with an embodiment.

FIG. 1 shows an analog multiplication circuit in accordance with an embodiment generally, as 100. A voltage (A) represents the voltage generated across one of the current measuring devices and is shown generated by voltage source 102. The negative terminal of the voltage source is coupled to ground, the positive terminal is coupled to a switch 104, the other side of which is connected to a node 112. A second switch 106 is connected between the node 112 and ground. A resistor R 114 is coupled between the node 112 and output terminal 118. A capacitor 116 is coupled between the output terminal 118 and ground.

The multiplier 100 takes advantage of the pulse width modulation (PWM) signal 108 which is already generated within the converter for the operation of the converter. The signal (D) represents the duty cycle of the main switch of the converter and the signal (1−D), which is generated by inverting the signal (D) via inverter 110, represents the duty cycle of a rectifier or synchronous switch of the converter. The switch 104 is closed when the signal (D) is in a first logic state and the switch 106 is open when the signal (1−D) is in a second logic state. The switch 104 is open when the signal (D) is in the second logic state and the switch 106 is closed when the signal (1−D) is in the first logic state. The first logic state may represent a digital "1" and the second logic state may represent a digital "0", for example. The voltage on node 112 is low pass filtered by the RC filter 114, 116 to generate a signal D*A at the output terminal 118. Thus, circuit 100 requires only two additional switches 104, 106, a resistor 114 and capacitor 116 to produce a simple multiplication circuit.

Figure 2:
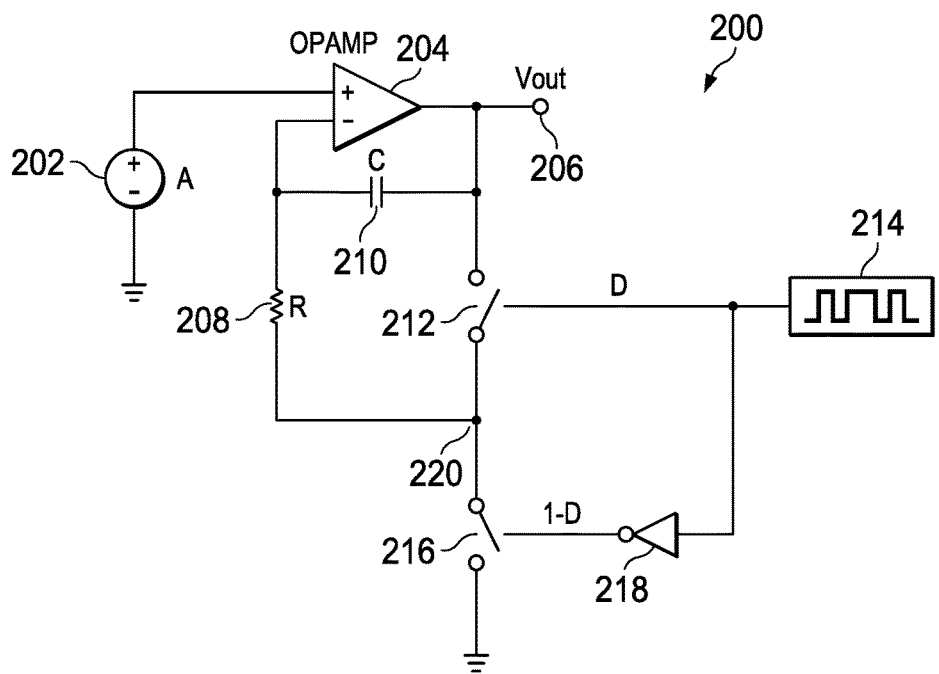
FIG. 2 is a schematic of an analog divider in accordance with an embodiment.

FIG. 2 shows a division circuit in an embodiment, generally as 200. A voltage (A) represents the voltage generated by one of the current sensing devices and is shown generated by a voltage source 202, which has a negative terminal coupled to ground. The positive terminal of voltage generating circuit 202 is coupled to the non-inverting input of operational amplifier 204. The output of operational amplifier 204 at terminal 206 is the output $V_{out}$ of the circuit. A capacitor C 210 is coupled between the output of the operational amplifier and the inverting input thereof. The voltage at the output terminal is also coupled to one side of a switch 212, the other side of which is coupled to a node 220. A second switch 216 has one end coupled to the node 220 and the other end coupled to ground. A resistor R 208 is coupled between the node 220 and the inverting terminal of the operational amplifier 204.

The divider 200 takes advantage of the pulse width modulation (PWM) signals 208 which are already generated within the converter for the operation of the converter. The signal (D) represents the duty cycle of the main switch of the converter and the signal (1−D), which is generated by inverting the signal (D) via inverter 218, represents the duty cycle of a rectifier or synchronous switch of the converter. The switch 212 is closed when the signal (D) is in a first logic state and the switch 216 is open when the signal (1−D) is in a second logic state. The switch 212 is open when the signal (D) is in the second logic state and the switch 216 is closed when the signal (1−D) is in the first logic state. The first logic state may represent a digital "1" and the second logic state may represent a digital "0", for example. In steady-state operation, the average voltages at the inverting and non-inverting inputs to the operational amplifier 204 must be equal. Therefore, $A=V_{out}*D$. Consequently, $V_{out}=A/D$. Thus circuit 200 requires the addition of only two switches 212, 216 a resistor R 208, a capacitor C 210 and operational amplifier 204, to produce a simple division circuit. Normally, division circuits are far more complex than multiplication circuits. Here, however, the only difference is the addition of the operational amplifier 204. It should be noted that if the voltage (A) is a DC voltage, the value of RC should be much much greater than the period of the switching signal used to generate the pulse width modulation (PWM) signal.

Figure 3:
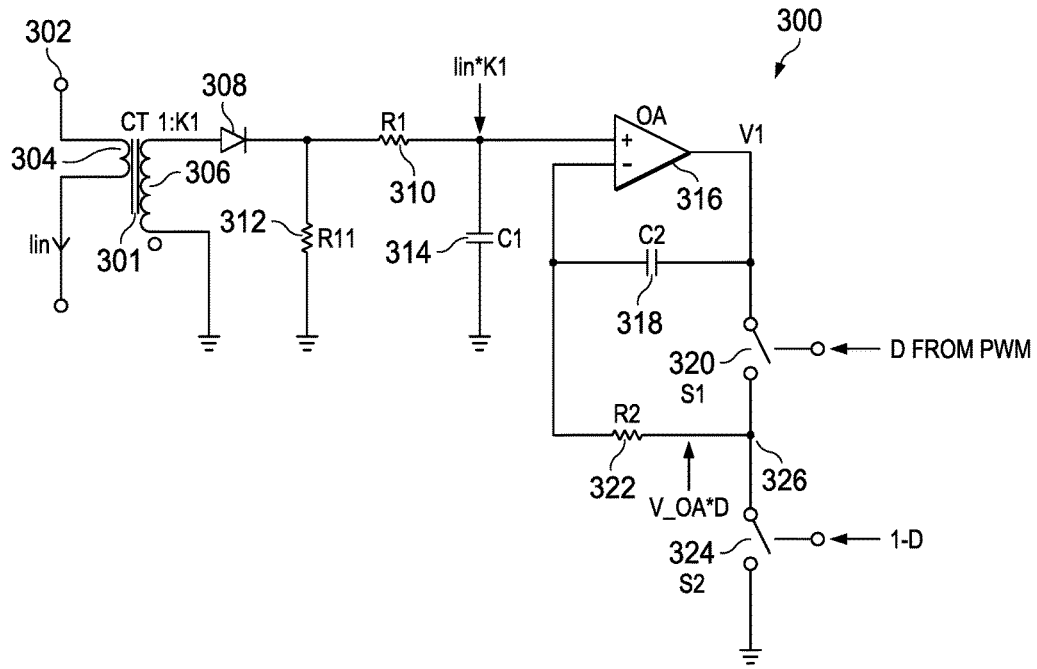
FIG. 3 is a schematic to calculate $I_{out}$.

FIG. 3 illustrates the use of the analog divider circuit to calculate the average output current $I_{out}$ from the input current $I_{in}$, generally as 300. The circuit has a current transformer 301 which receives the input current $I_{in}$ from the switch (not shown) at 302, which passes through winding 304. This circuit illustrates the problem described in the background portion of the present application in which the input current is a high-value current and where the use of a resistive shunt to measure the current would cause excessive losses. The current transformer 301 has a ratio of 1:K1 so the measured input current is K1 times more than the output current. The current transformer 301 has a secondary winding 306, having one end thereof coupled to ground, the other end coupled to the anode of a diode 308. The cathode of diode 308 is coupled to a node having a resistor R11 312 coupled to ground, which generates a voltage proportional to the input current applied to the primary winding 304. A low pass filter comprising resistor R1 310 and capacitor C1 314 is connected across the resistor R11 312. The low pass filter 310, 314 generates a signal related to the average current through the primary winding 304 of current transformer 301. The voltage at the node between resistor 310 and capacitor 314 is applied to the non-inverting terminal of operational amplifier 316. The output V1 of the operational amplifier 316 is connected to one terminal of a switch S1 320, the other terminal of which is connected to a node 326. The node 326 is connected to one terminal of a resistor R2 322, the other terminal of which is connected to the inverting input of operational amplifier 316. A capacitor C2 318 is connected between the output V1 of the operational amplifier and inverting input thereof. The node 326 is coupled to one side of switch S2 324, the other side of which is coupled to ground.

The divider 300 takes advantage of the pulse width modulation (PWM) signals which are already generated within the converter for the operation of the converter. The signal (D) represents the duty cycle of the main switch of the converter (not shown) and the signal (1−D), which may be generated by inverting the signal (D) represents the duty cycle of a rectifier or synchronous switch of the converter (not shown). The switch 320 is closed when the signal (D) is in a first logic state and the switch 324 is open when the signal (1−D) is in a second logic state. The switch 320 is open when the signal (D) is in the second logic state and the switch 324 is closed when the signal (1−D) is in the first logic state. The first logic state may represent a digital "1" and the second logic state may represent a digital "0", for example.

A pulsed input signal is generated by the switch (not shown) at 302 which passes through the primary winding 304 of current transformer 301. This generates a current through the secondary winding 306 equal to $I_{in}*K1$. That current flows through diode 308 and resistor R11 312 to ground. The voltage generated across resistor R11 312 is representative of the current $I_{in}$ multiplied by the ratio K1. This voltage is averaged by the low pass filter comprising resistor R1 310 and capacitor C1 314 to generate a voltage representative of the average value of the input current $I_{in}*K1$.

The signal $I_{in}*K1$ is applied to the non-inverting input of operational amplifier 316. Thus, the output voltage of the operational amplifier V1*D is equal to $I_{in}*K1$. Solving the equation for V1:

$$V_1=I_{in}*K1/D$$

Recalling equation 1, for a buck circuit:

$$I_{in}=I_{out}*D$$

so that $$I_{out}=I_{in}/D$$

Therefore:

$$V1=I_{out}*K1$$

We now have $I_{out}*K1$ which is related to the diode $I_{in}$ by the turns ratio (constant) K1. If the turns ratio is in unity, for example, then V1 equals $I_{out}$. Thus, through the use of the equations and an average value of an accessible current, we can obtain the value of an inaccessible current. This value can also be used as the variable for control of the power converter. In this particular case, the ripple in the filter 310, 314 is in phase with the ripple in filter 318, 322 which allows very low values of the resistors and capacitors to be used in the filters (less than the period of the switching frequency), therefore, response time is excellent.

Figure 4:
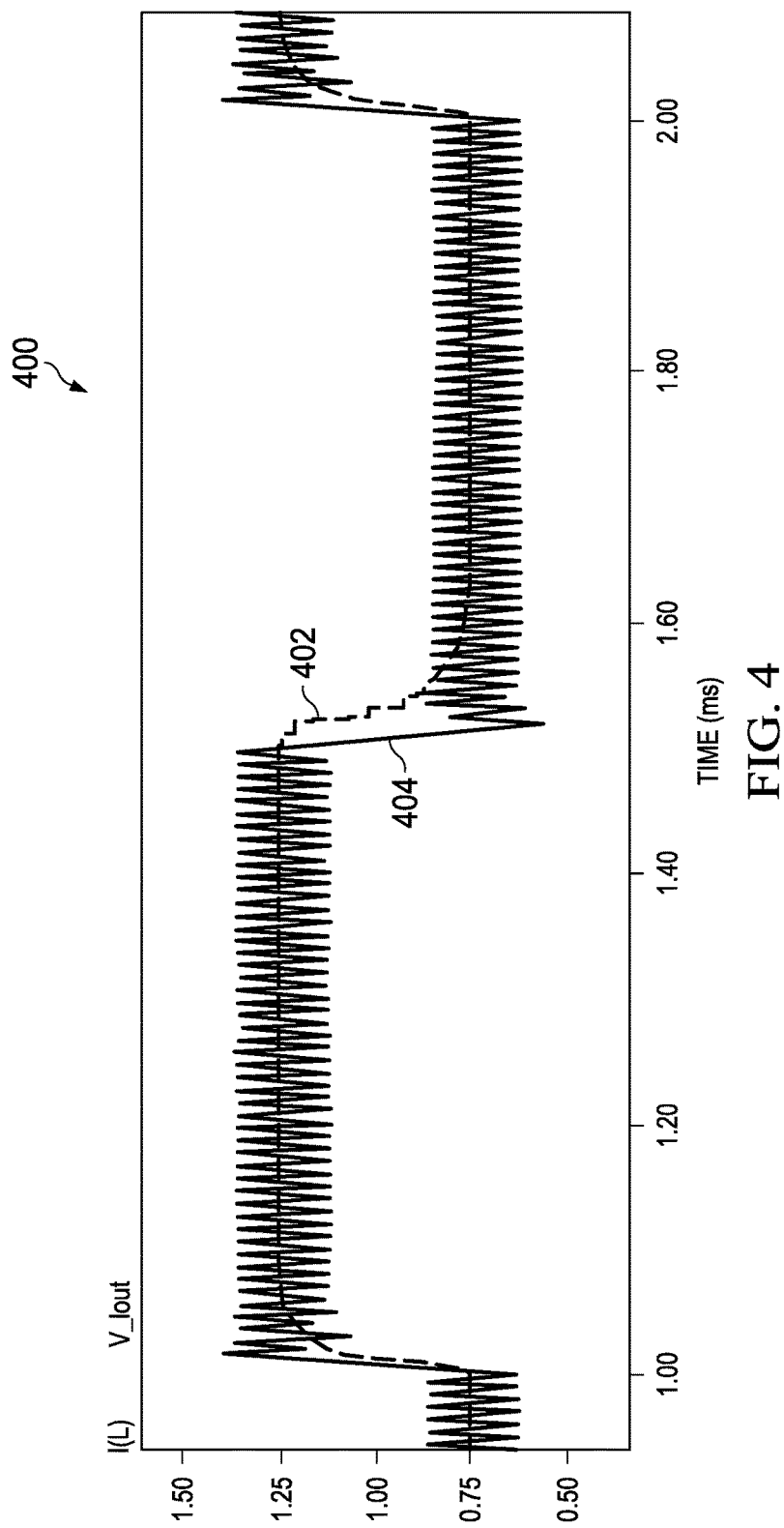
FIG. 4 illustrates the waveforms of the circuit of FIG. 3.

FIG. 4 shows a simulation of the circuit shown in FIG. 3, generally as 400. In this simulation, the time constant R1 310, C1 314 equals the time constant R2 322, C2 318 which equals the period of the switching frequency. The signal 404 represents the current in the inductor and the waveform 402 represents the output of the circuit shown in FIG. 3, that is at V1. As can be seen, the waveform 402 is a substantially DC waveform which follows the actual waveform of the inductor current very well, even during the transitions. Thus, the circuit shown in FIG. 3 yields a very accurate depiction of the output current, even though only the input current can be measured.

Figure 5:
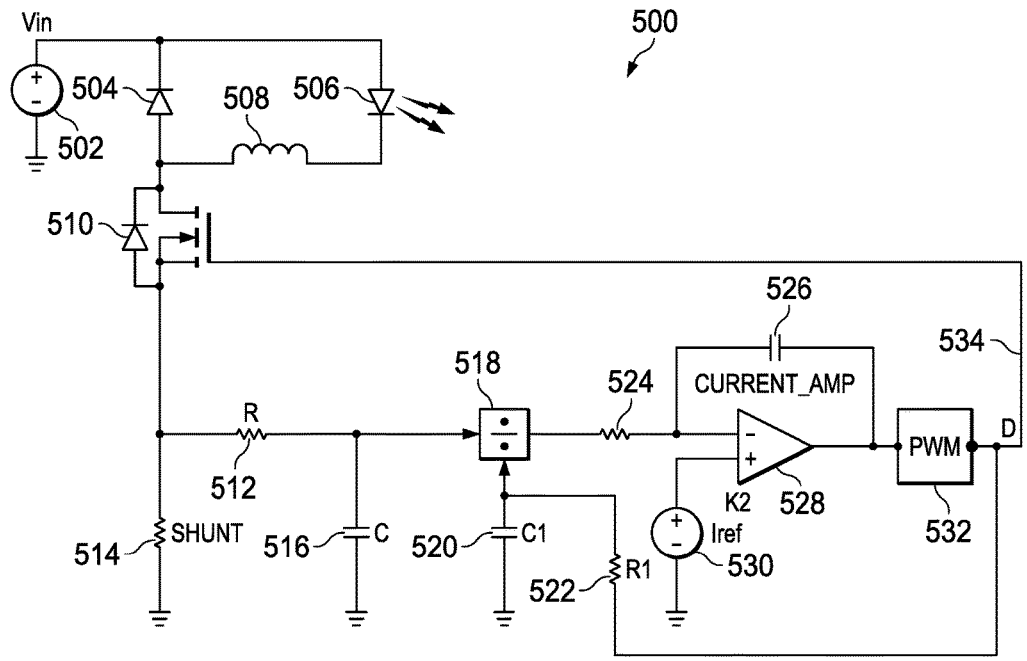
FIG. 5 shows the regulation of average output current.

FIG. 5 shows a circuit for controlling a buck regulator, generally as 500. In this circuit, it is desired to control the output current of the buck regulator which flows through LED 506. However, only the input current is accessible. This could be because the LEDs are physically separate from the regulator, for example. The buck regulator comprises a switch 510 coupled to the anode of the diode 504, the cathode of which is coupled to the positive terminal of the input voltage 502. The negative terminal of input voltage source 502 is coupled to ground. Inductor 508 is coupled to the switch 510 and the LED(s) 506 which are in series with the inductor and coupled between the input voltage and the switch 510. A shunt 514 is coupled between the switch 510 and ground. The shunt provides a voltage which is representative of the current flowing through the switch. Voltage across the shunt is coupled to a RC low pass filter comprising resistor 512 and capacitor 516. This produces a voltage related to the average current through the shunt. This voltage is fed into divider circuit 518, such as the divider circuit shown in FIG. 3. The divider is operated by the signal (D) which is output from the pulse width modulation (PWM) circuit 532 and coupled through the averaging circuit comprising resistor R1522 and capacitor C1 520 to operate the divider circuit 518, as discussed above in connection with FIG. 3. The output of the divider is coupled via resistor 524 to the inverting input of a current amplifier 528. A capacitor 526 is coupled between the output of current amplifier 528 and the inverting input thereof. A current reference 530 having a value K2 has a positive terminal connected to the non-inverting input of amplifier 528 and negative terminal coupled to ground. The output of the current amplifier 528 is coupled as an input to the pulse width modulation (PWM) circuit 532. The pulse width modulation (PWM) circuit 532 generates the signal (D).

The power converter 500 works by regulating the current utilizing the equation 1:

$$I_{out}*D=I_{in}$$

solving for $I_{out}$ $$I_{out}=I_{in}/D$$

The loop regulates the output current by forcing it to K2, the value of the current reference 530. Thus, the current through the LED(s) can be maintained constant, as is preferable for operating LED(s), without actually measuring the current therethrough.

Figure 6:
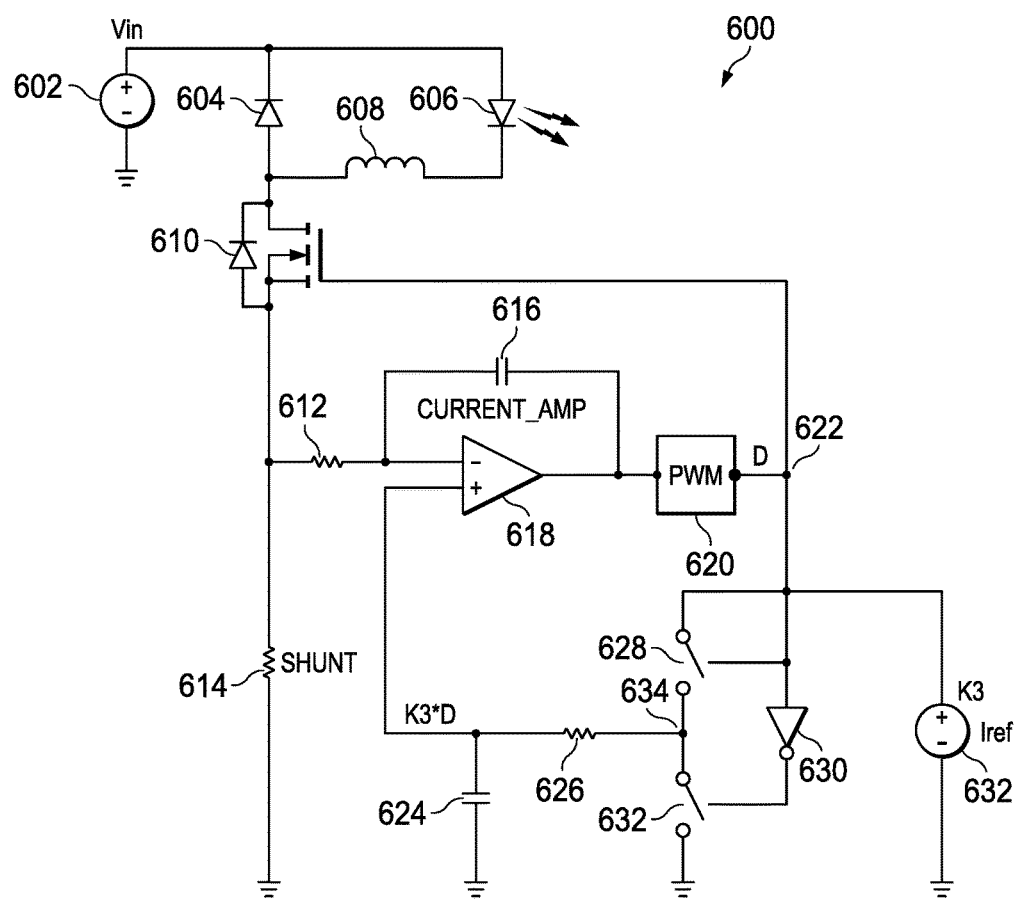
FIG. 6 shows a simplification of the circuit of FIG. 5.

FIG. 6 shows a circuit for implementing the concepts shown in FIG. 5. However, the circuit shown in FIG. 6 has been simplified by regulating the loop to $I_{in}$ equals K3*D instead of regulating the loop so that $I_{in}$/D equals K2. In FIG. 6, the buck regulator comprises a switch 610 coupled to the anode of the diode 604, and the cathode which is coupled to the positive terminal of the input voltage 602. Inductor 608 is coupled to the switch 610 and the LED(s) 606 which are in series with the inductor 608 and coupled between the input voltage and the switch 610. A shunt 614 is coupled between the switch 610 and ground. The shunt provides a voltage which is representative of the current flowing through the switch. The voltage across the shunt 614 is coupled via resistor 612 to the inverting input of the current amplifier 618. The output of the current amplifier 618 is coupled via capacitor 616 back to the inverting input thereof. The output of the current amplifier 618 is also coupled as an input to the pulse width modulation (PWM) circuit 620. The output of the pulse modulation circuit (D) is coupled to a node 622 which is also coupled to the gate of switch 610. A current reference K3 632 has its negative terminal coupled to ground and its positive terminal coupled to one side of switch 628. The other side of switch 628 is coupled to node 634. The switch 628 is operated by the signal (D) at node 622. The signal (D) is inverted by inverter 630 and applied to a switch 632 which is coupled from the node 634 to ground. The node 634 is coupled via resistor 626 to one side of capacitor 624, the other side of which is coupled to ground. The voltage across capacitor 624 is coupled to the non-inverting input of current amplifier 618.

In FIG. 6, the circuit comprising switches 628 and 632 and resistor 626 and capacitor 624 are combined to produce a multiplier circuit, as discussed above in the present application. Therefore, the voltage across capacitor 624 becomes K3*D where (D) is the duty cycle signal node 622. Thus, the loop regulates the input current to K3*D instead of regulating $I_{in}$/D to equal K3. By making K3 a constant, the current through the LED(s) 606 remains constant. The disadvantage of this circuit is that there is no available measurement of the current that is being regulated. However, if that is not needed, as in many cases where the object is to maintain a current constant, the circuit becomes incredibly simple.

Figure 7:
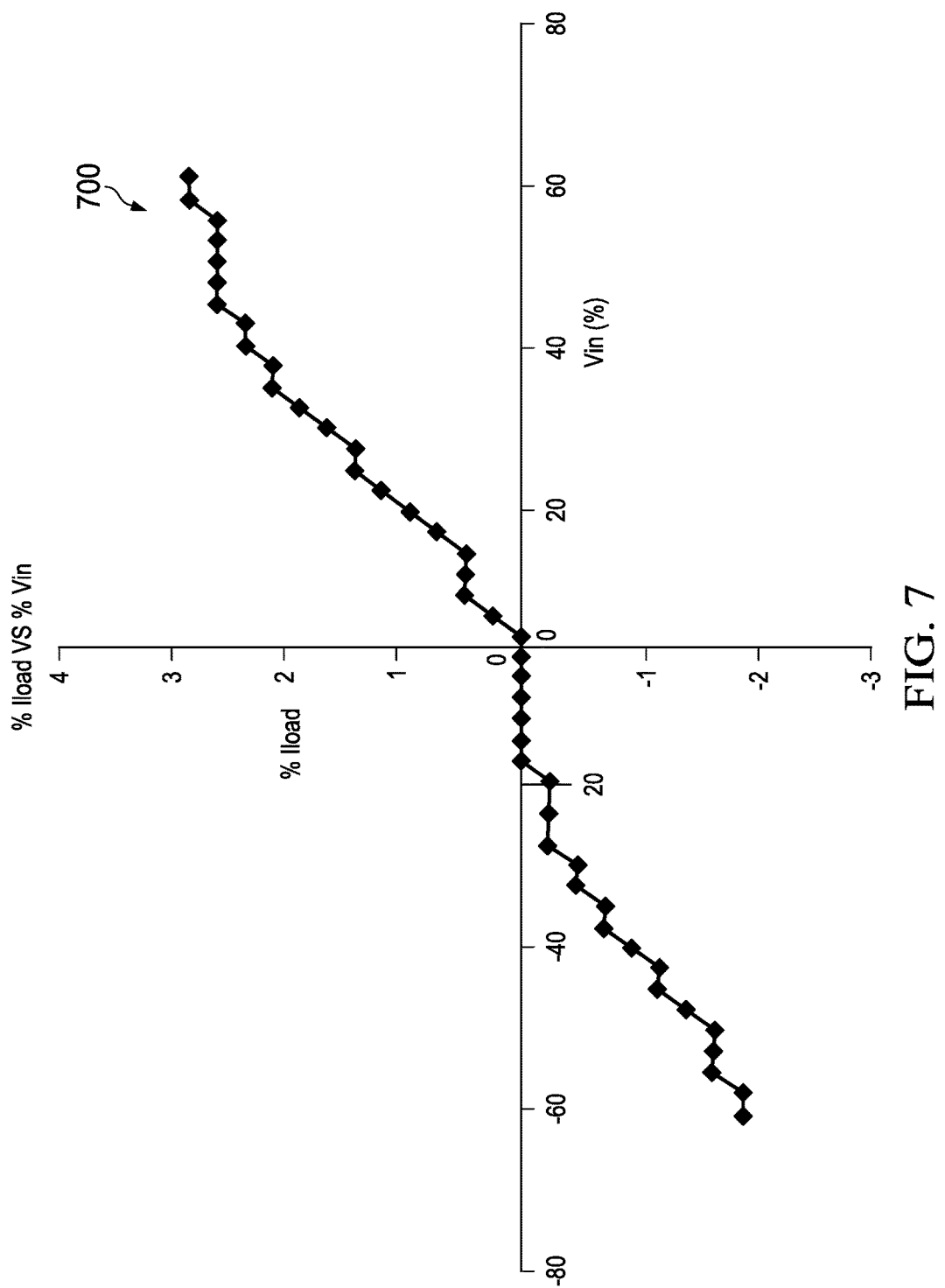
FIG. 7 shows the line regulation of the circuit of FIG. 6.
Figure 8:
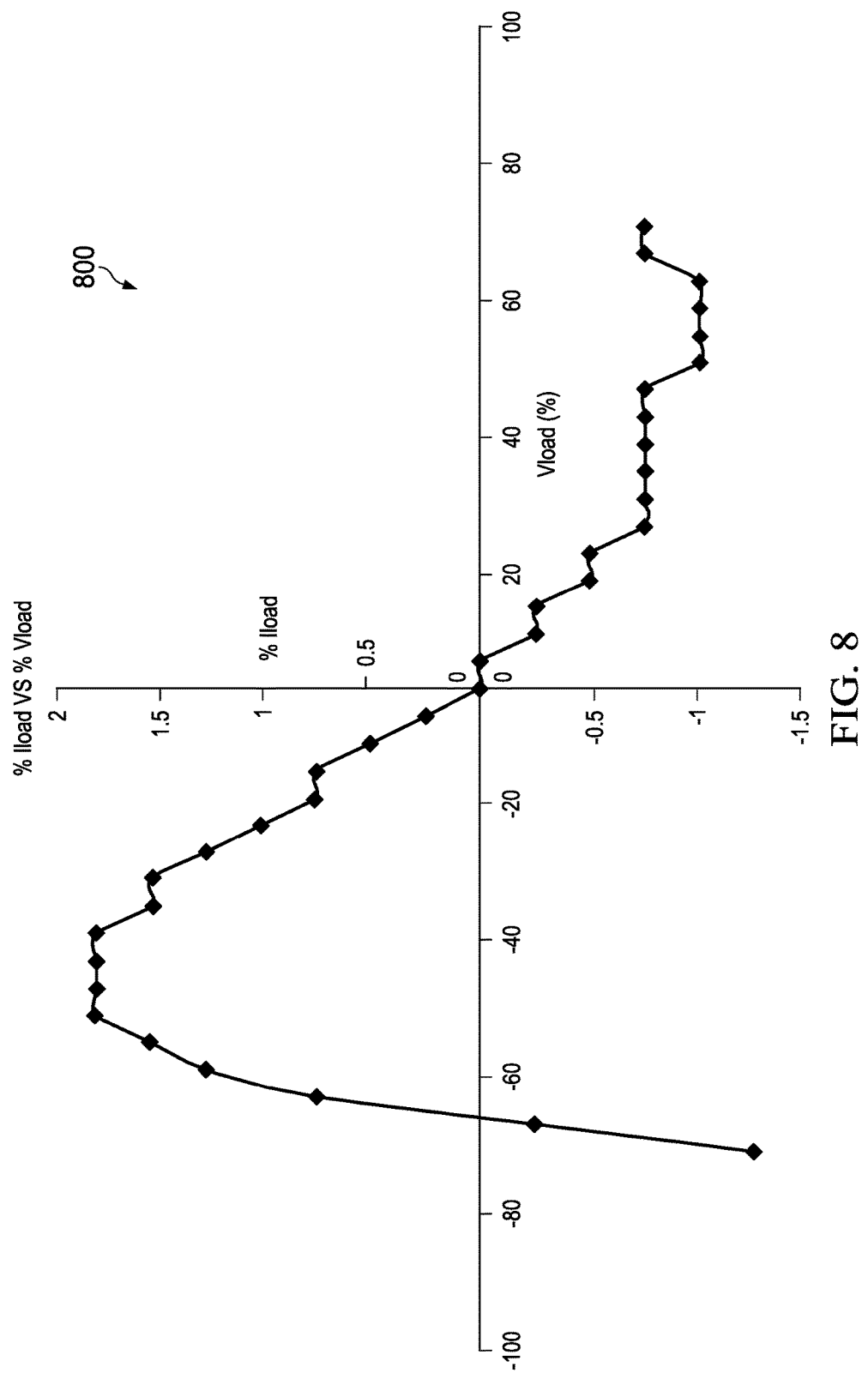
FIG. 8 shows the load regulation of the circuit of FIG. 6.

The simplicity of the circuit shown in FIG. 6, does not detract from its performance, as shown in FIGS. 7 and 8. FIG. 7 shows line regulation, generally at 700. The X axis shows the change in input voltage as a percentage and the y-axis shows the percent of variation of Iload. As can be seen, the voltage change of the input voltage of 60% only creates a 3% variation in the load current. FIG. 8 shows the load regulation, generally as 800. This shows the percent change in Iload (y-axis) with respect to percent change in Vload (x-axis). As can be seen from FIG. 8, causing a 60% change in Vload only results in a 1.6% change in Iload. Thus, although the circuit in FIG. 6 is incredibly simple, it also yields excellent results.

Figure 9:
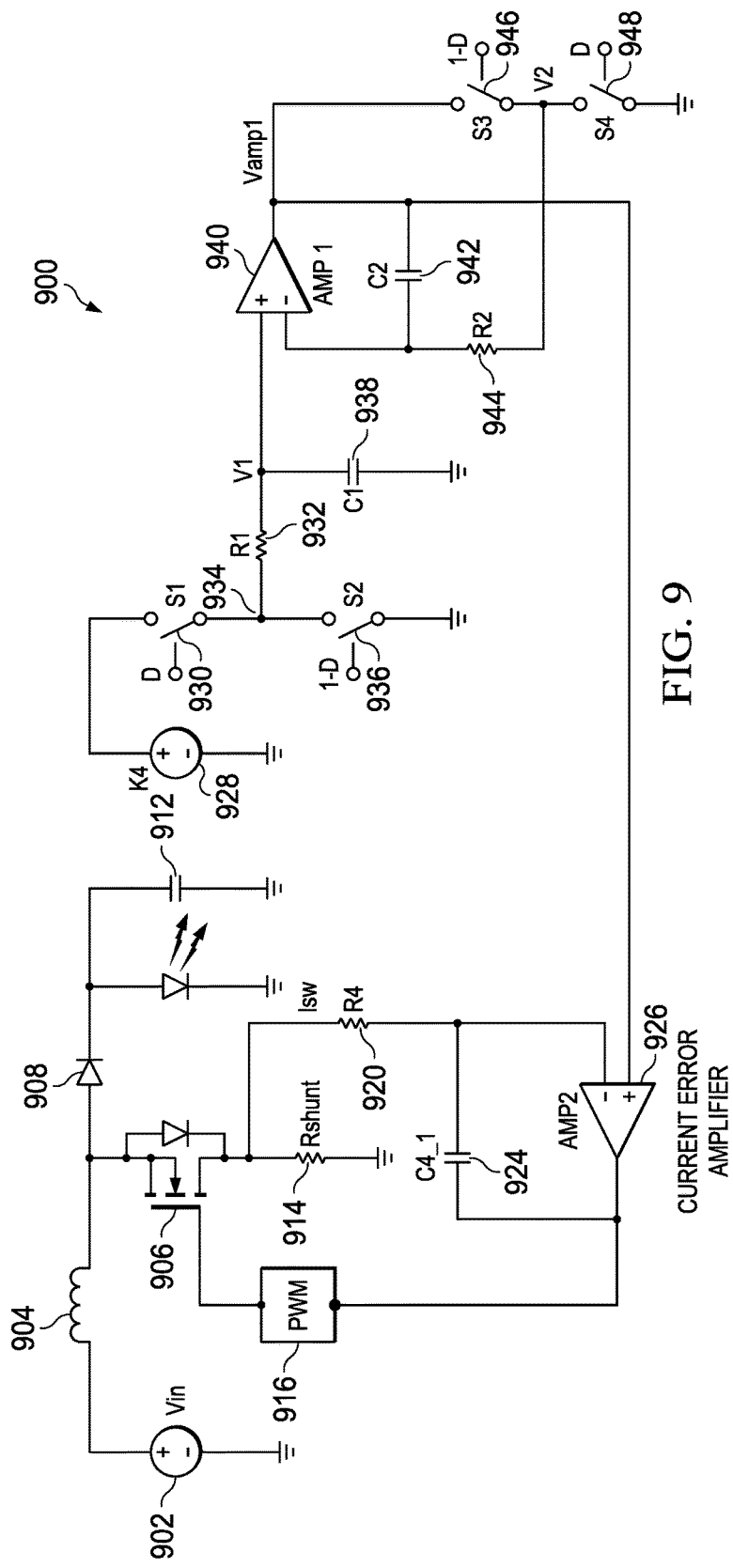
FIG. 9 shows regulating the average output current of a boost converter.

FIG. 9 shows a control circuit that uses the current in the power switch of a boost converter to indirectly regulate the average output current of the converter. A voltage source 902 has a negative terminal connected to ground and its positive terminal connected to one side of inductor 904, the other side of which is connected to a node. The node has a transistor switch 906 coupled thereto, one terminal of the conduction channel being coupled through resistor Rshunt 914 to ground. Also connected to the node is the anode of a diode 908, the cathode of which is connected to the anode of LED(s) 910, which is the load for the boost converter, the cathode of which is connected to ground. A capacitor 912 is coupled across the load 910. The transistor switch 906 is controlled by a pulse width modulation (PWM) circuit 916 which is driven by the output of error amplifier 926. The inverting input of the error amplifier is connected through resistor R4 920 to the junction of the switch 906 and the shunt 914. A capacitor C4-1 924 is coupled across the inverting input to the output of the current error amplifier 926. A voltage source 928 generates a voltage K4 representative of the desired current output from the converter. The negative terminal of the voltage source 928 is connected to ground and the positive terminal thereof is connected to one side of a switch S1 930. The other side of switch S1 930 is connected to node 934 which is also connected to one side of switch S2 936. The other side of switch S2 936 is connected to ground. The node 934 is coupled via resistor R1 932 to the node V1 from which a capacitor C1 938 is coupled to ground. The voltage V1 is connected to the non-inverting input of amplifier 940. The output of amplifier 940 Vamp1 is connected to one terminal of switch S3 946, which is coupled to a node V2. The node V2 is connected via resistor R2 944 to the inverting input of amplifier 940. A capacitor C2 942 is connected between the output amplifier 940 and the inverting input thereof. The voltage V2 is coupled to one terminal of switch S4 948, the other terminal of which is connected to ground. The voltage Vamp1 is coupled to the non-inverting input of amplifier 926.

In operation, the voltage K4 is chosen to select the desired output current from the converter. In the converter illustrated in FIG. 9 the load is an LED or a string of LEDs, which, as is well known to those skilled in the art, is preferably operated with a constant current rather than a constant voltage in order to control the brightness of the LED(s). The switch S1 930 is operated by the signal (D) which is the duty cycle signal generated by the pulse width modulation (PWM) circuit 916 and utilized to operate the converter, and the switch S2 936 is operated by the signal (1−D) which can be the inverted signal (D) (not shown). The signal generated at node 934 is averaged by low pass filter R1 932 and capacitor C1 938 to generate a voltage at the node V1 equal to K4*D. The signal on the output of amplifier 940 Vamp1 is divided by switch S3 946, operated by the signal (1−D) and the switch and S4 948 operated by the signal (D). Therefore, the signal at the node V2 will be equal to Vamp1*(1−D). In a properly operating circuit, in steady-state, the voltage input to the amplifier 940 must be equal. Therefore:

$$V1=V2$$

Thus:

$$V_{amp1} = K4 \cdot D/(1-D).$$

Assuming amplifier to 926 is properly operating and in steady-state, the voltage at both inputs must be equal. Therefore, utilizing equation 2, we know that:

$$I_{sw} = V_{amp1}, \text{ which} = K4 \cdot D/(1-D).$$

We also know that:

$$I_{sw} = I_{out} \cdot (1-D)/D.$$

Solving the equation for $I_{out}$:

$$I_{out} = I_{sw} \cdot (1-D)/D.$$

Therefore:

$$I_{out} = K4 \cdot D/(1-D) \cdot (1-D)/D, \text{ which} = K4.$$

Therefore, the current has been regulated to a value represented by the voltage K4.

Figure 10:
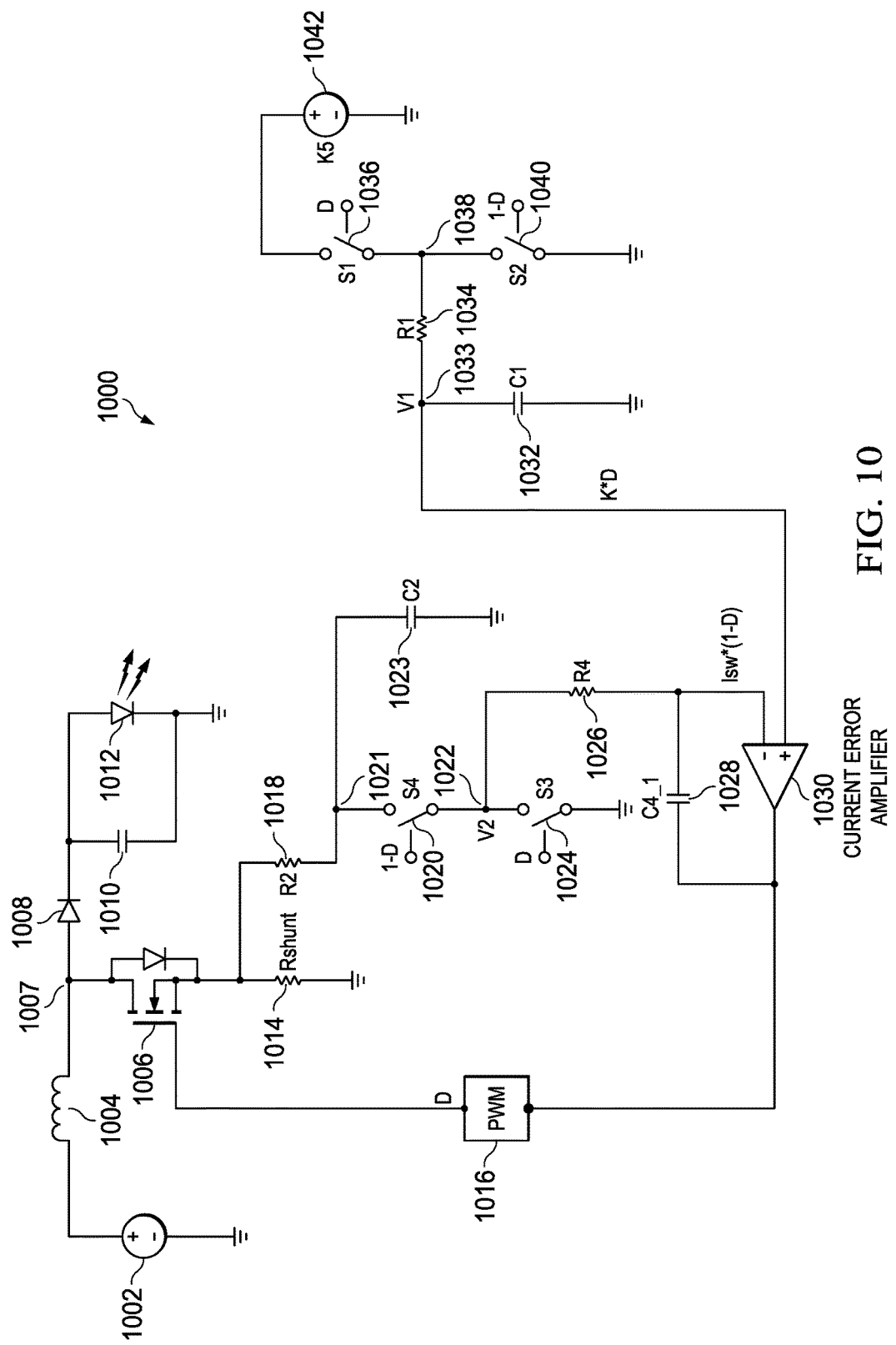
FIG. 10 shows the circuit of FIG. 9 with the divider circuit eliminated.

As with the embodiments shown in FIGS. 5 and 6, if the desire is to regulate the current but not require a measure of that current, the circuit can be simplified. Thus, in the circuit shown in FIG. 5, the current may be measured, whereas in the circuit shown in FIG. 6, the current measurement was not available but the circuit was much simpler. FIG. 10 is a simpler circuit than FIG. 9, which eliminates the divider circuit shown in FIG. 9.

In FIG. 10, a voltage source 1002 has a negative terminal connected to ground and its positive terminal connected to one terminal of inductor 1004, which has the other terminal connected to a node 1007. One terminal of the conduction channel of a switch transistor 1006 is connected to the node 1007, the other terminal of the conduction channel is connected to ground through Rshunt 1014. The node is also connected to the anode of a diode 1008, the cathode of which is connected to the anode of an LED or string of LEDs 1012, which is the load for this converter, a cathode of which is connected to ground. A capacitor 1010 is connected across the load 1012. A voltage K5 is generated by voltage source 1042 which has its negative terminal connected to ground and its positive terminal connected to one end of switch S1 1036. The other terminal of switch 1036 is connected to node 1038. The node 1038 is also connected to one terminal of switch S2 1040, the other terminal which is connected to ground. The voltage K5 is related to the desired current through the load 1012. The node 1038 is connected through resistor R1 1034 to one terminal of capacitor C1 1032, the other terminal of which is connected to ground. A voltage V1 is developed at the junction 1033 between the resistor and the capacitor. This voltage V1 is coupled to the non-inverting input of current error amplifier 1030. The inverting input of current error amplifier 1030 is connected via resistor R4 1026 to a node 1022. The node 1022 is connected to ground via a switch 1024, operated by the signal (D) and connected to a node 1021 via a switch 1020, operated by the signal (1−D). The node 1021 is connected to the juncture of the shunt 1014 and the switching transistor 1006 via resistor R2 1018. The node 1021 is also connected to capacitor C2 1023, the other terminal of which is connected to ground. A capacitor C4-1 1028 is connected between the inverting input of current error amplifier 1030 and its output. The output of amplifier 1030 is connected to an input of pulse width modulation (PWM) circuit 1016, which outputs the signal (D) that operates switches S1-S4 and the switching transistor 1006.

In operation, the signal (D) is used to operate the switches S1 1036 and S3 1024. The inverse of the signal (D), (1−D), is used to operate the switches S2 1040 and S4 1020. The voltage K5 is related to the current which is desired to be regulated through the load, herein, LED(s). The resistor R1 1034 and capacitor C1 1032 form a low pass filter for the signal at node 1038. Therefore, the voltage V1 at node 1033 will be equal to K5·(1−D). The filter circuit formed by resistor R2 1018 and C2 1023 averages the voltage across Rshunt 1014. This average voltage is applied to the multiplier comprising switches S3 1024 and S4 1020 which multiplies the value $I_{sw}$ by (1−D) to generate a signal $I_{sw} \cdot (1-D)$ which is applied to the inverting input of current error amplifier 1030. If the circuit is operating properly and in steady-state, the voltage at both the inverting and non-inverting inputs of the current amplifier 1030 must be equal; Therefore:

$$V1 = V2$$

If V1 equals V2, then:

$$I_{sw} \cdot (1-D) = K5 \cdot D$$

Solving for $I_{sw}$:

$$I_{sw} = K5 \cdot D/(1-D)$$

We know from equation 2 that:

$$I_{out} = I_{SW} \cdot (1-D)/D$$

Substituting, the result is that $I_{out}$ is equal to K5. The result is that the output current is equal to a chosen voltage representative of the desired output current and is the same for the circuit shown in FIGS. 9 and 10, except that the circuit shown in FIG. 10 is far simpler. In many cases, it is not necessary to know the value of the current that is being regulated, and in this situation, the circuit shown in FIG. 10 is superior because it is less-complex.

Figure 11:
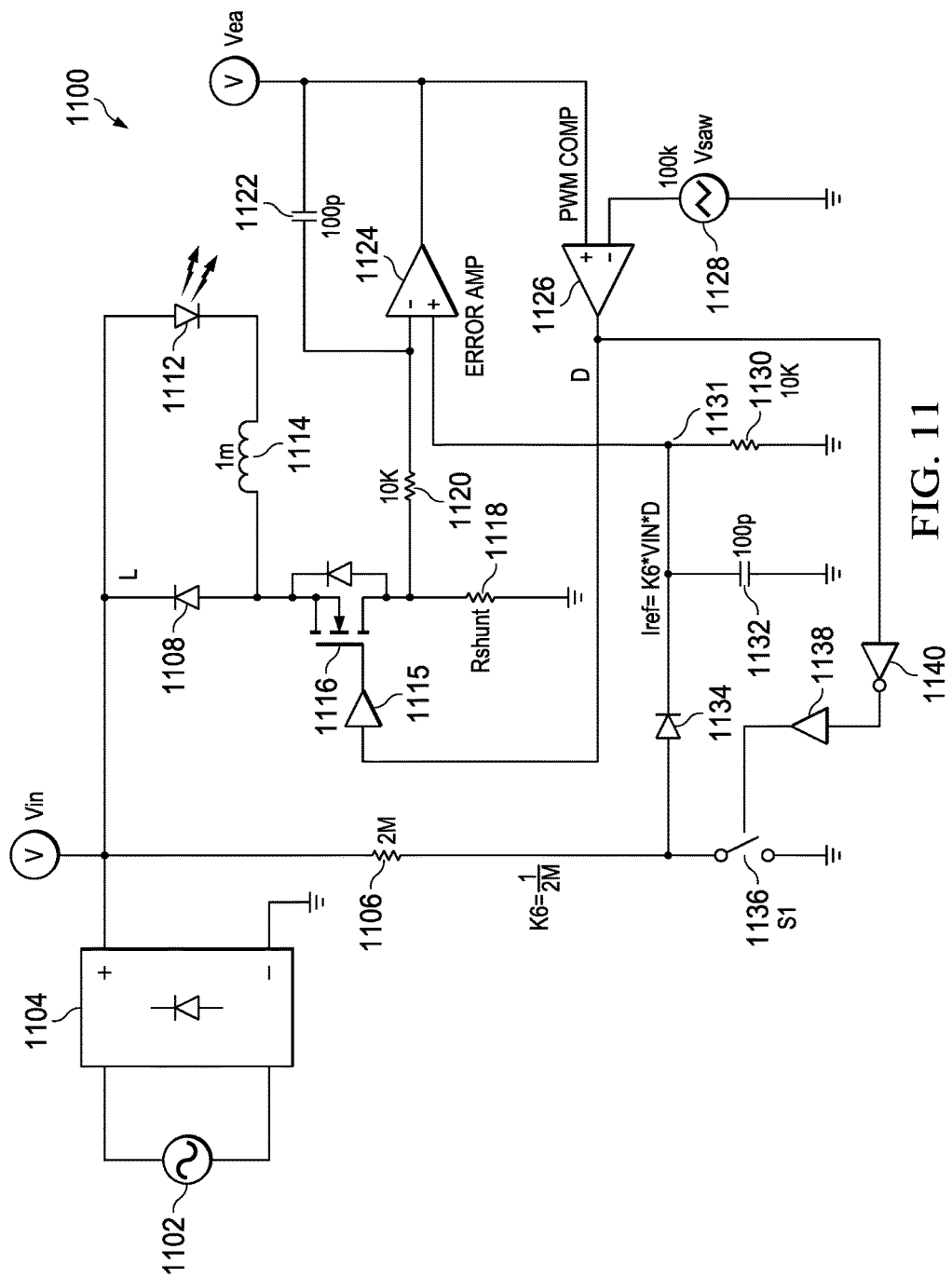
FIG. 11 shows a schematic of a voltage-to-current converter.

FIG. 11 shows the versatility of the present invention. The circuit shown in FIG. 11 illustrates the utilization of a phase-cut dimmer to dim an LED. As is well known to those skilled in the art, LEDs are preferably operated with a constant current since the amount of light they produce is related to the current through the LED. A well-known problem is that when the LEDs are operated from a phase-cut dimmer, the dimmer changes the voltage applied to the LED and its driver circuit and the driver circuit fights the changing voltage made by the dimmer in order to try to operate the LED at the chosen constant current.

In FIG. 11, an LED driver circuit is shown, generally as 1100. A dimmer, which may be a phase-cut dimmer, 1102 is coupled to a rectifier circuit 1104 and produces an output voltage $V_{in}$ on the positive terminal thereof. This voltage is coupled to the cathode of the diode 1108 and the anode of an LED 1112. The anode of diode 1108 is coupled to one end of inductor 1114, the other end of which is connected to the cathode of the LED 1112. The node at the junction of the anode of diode 1108 and the inductor 1114 is coupled to one terminal of the conduction channel of switching transistor 1116. The other terminal of switching transistor 1116 is coupled to ground via Rshunt 1118. The voltage across Rshunt 1118 is coupled via resistor 1120 to the inverting input of amplifier 1124. The inverting input of amplifier 1124 is also coupled to the output of the error amplifier 1124 via capacitor 1122. The negative terminal of rectifier 1104 is coupled to ground. The positive voltage $V_{in}$ is coupled via a resistor 1106, which may be 2 MΩ for example, to one terminal of switch S1 1136. The other terminal of the switch S1 1136 is connected to ground. The node between resistor 1106 and the first terminal of switch S1 1136 is connected to the anode of the diode 11348, which is connected to the non-inverting input to error amplifier 1124. Also connected to the cathode of diode 1134 is a resistor 1130 which has its other terminal connected to ground and a capacitor 1132 which has its other terminal connected to ground. A pulse width modulation (PWM) circuit 1126(D) receives the output of sawtooth waveform generator 1128 on its inverting input. The non-inverting input to pulse width modulation (PWM) circuit 1126 is coupled to the output of amplifier 1124. The output of pulse width modulation (PWM) circuit 1126 is coupled through buffer 1115 to the gate of switching transistor 1116 and through inverter 1140 and buffer 1138 to operate the switch S1 1136. Thus, the switch S1 1136 is operated by the signal (1−D).

In the circuit shown in FIG. 11, K6 is a current rather than a voltage and is equal to 1 divided by resistor 1106, or in this case, ½ MΩ In addition, the first switch in the multiplier has been replaced with a diode 1134. When switch S1 1136 is open, current flows through diode 1134 into capacitor 1132. When switch S1 1136 is closed, the anode of diode 1134 is grounded so that no current flows into the capacitor 1132 and the capacitor discharges through the resistor 1130. This generates a reference current at node 1131 equal to $K6*V_{in}*D$, which is applied to the non-inverting input error amplifier 1124. The voltage across Rshunt 1118 is applied via resistor 1120 to the inverting input of error amplifier 1124 where it is averaged in conjunction with the capacitor 1122 in the feedback loop. The output of error amplifier 1124 is fed into the non-inverting input of pulse width modulation (PWM) circuit 1126 which receives its sawtooth waveform on the inverting input thereof from source 1128. The error amplifier 1124 controls the operation of pulse width modulation (PWM) circuit 1126 to generate a pulse width modulation (PWM) signal (D) (as is well known in the art) which is applied through buffer 1115 to the gate of switching transistor 1116 and applied through inverter 1140 and buffer 1138 to operate the switch S1 1136. From equation 1, we know that:

$$I_{sw}=I_{in}.$$

Here $I_{sw}$ is equal to $K6*V_{in}*D$.
In addition:

$$I_{out}=I_{in}/D$$

This results in $I_{out}=K6*V_{in}$.

Therefore, the output current through the LED 1112 is a linear function of the input voltage, which produces the desired dimming effect without the LED driver fighting the change in voltage produced by the dimmer 1102.

Figure 12:
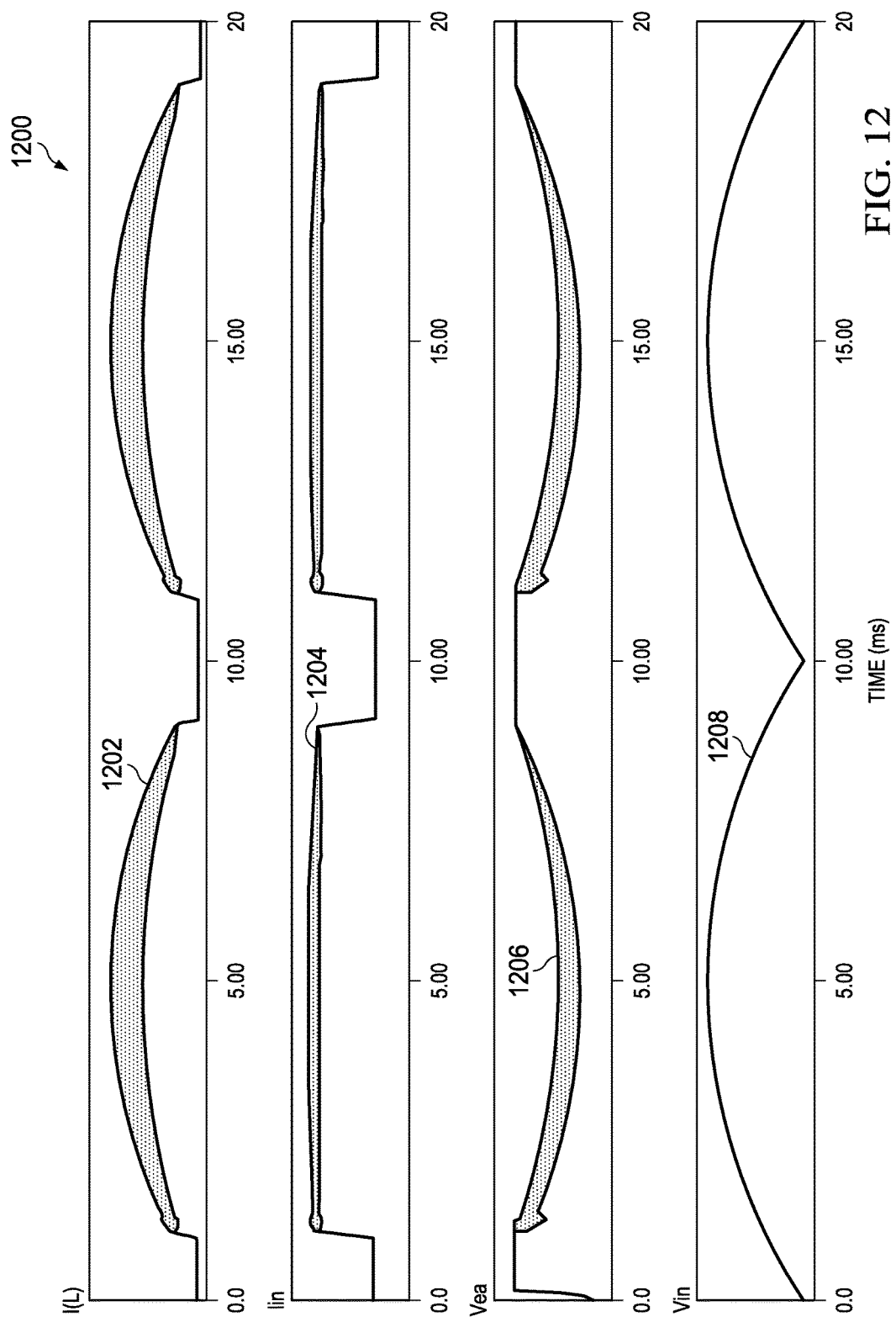
FIG. 12 shows the waveforms of the circuit of FIG. 11.

FIG. 12 shows the waveform for the circuit shown in FIG. 11. Waveform 1202 corresponds to the inductor current, waveform 1204 corresponds to the input current. Waveform 1206 corresponds to the voltage of Vea at the output of error amplifier 1124. Waveform 1208 corresponds to the input voltage. In operation, the output voltage is constant so that the output current follows the input voltage waveform. The reference for the input current is DC, so the input current is constant throughout the cycle and the driver input current will be a square wave with power factor of approximately 0.91.

Figure 13:
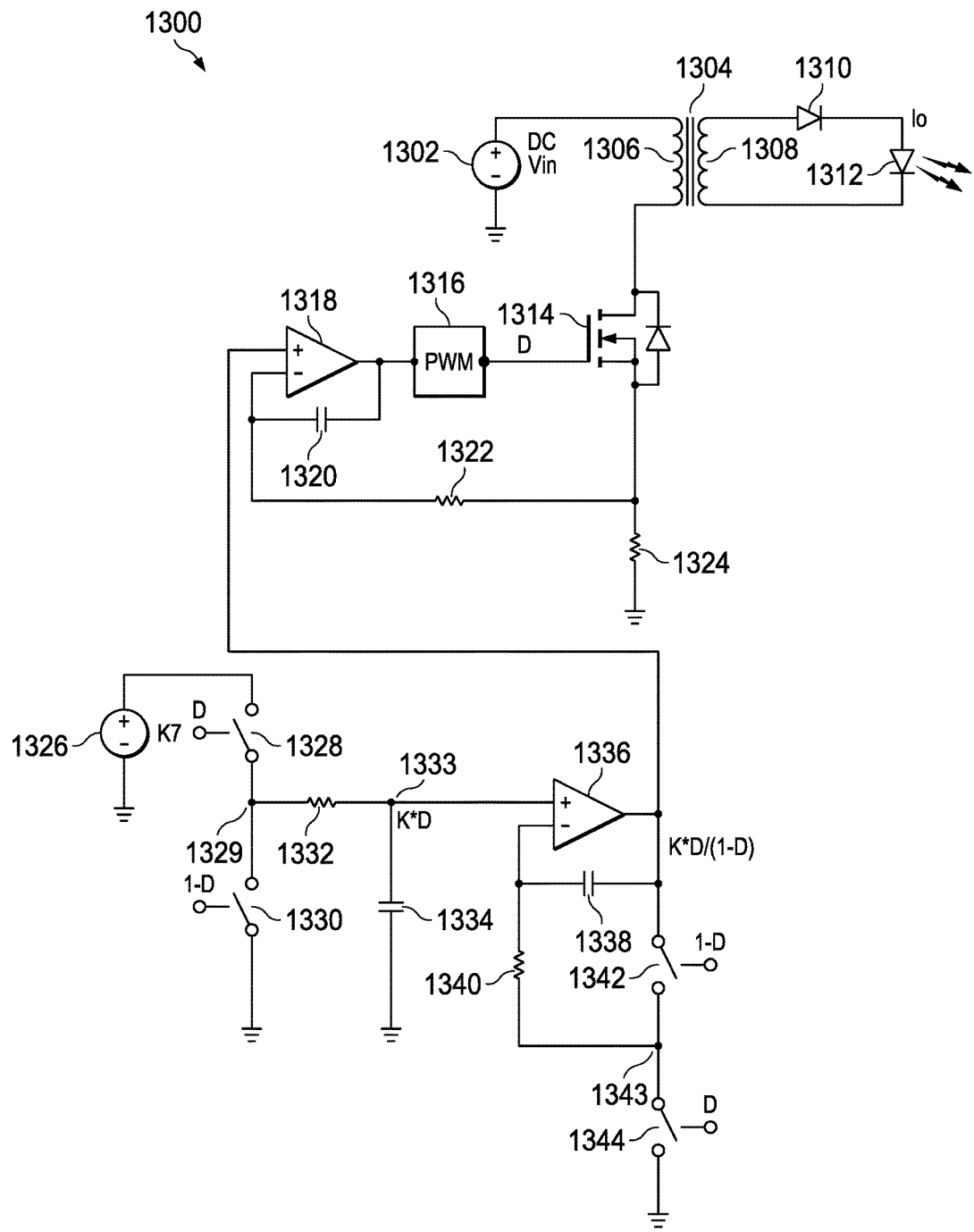
FIG. 13 shows a buck-boost (flyback) converter.

FIG. 13 shows a buck-boost (flyback) circuit, generally as 1300. A DC voltage source 1302 has its negative terminal coupled to ground, its positive terminal connected to one terminal of the primary winding 1306 transformer 1304. The other end of primary winding 1306 is coupled to the conduction channel of a switching transistor 1314, the other terminal of which is connected through a shunt 1324 to ground. The switching transistor 1314 is operated by a signal (D) output from pulse width modulation (PWM) circuit 1316. The pulse width modulation (PWM) circuit 1316 is operated under the control of amplifier 1318 which has its inverting input coupled to the node between transistor 1314 and shunt 1324 by resistor 1322. A capacitor 1320 is coupled between the inverting input and the output of error amplifier 1318. A circuit 1326 produces a voltage representative of the current desired at the output of the power converter. It is coupled via switch 1328 to a node 1329, which in turn is coupled to ground via a switch 1330. The node 1329 is coupled via resistor 1332 to a node 1333 which is coupled to ground via capacitor 1334. The voltage at node 1333 is coupled to the non-inverting input of amplifier 1336, the output of which is coupled to the non-inverting input of error amplifier 1318. A capacitor 1338 is coupled between the output of amplifier 1336 and the inverting input thereof. The inverting input of amplifier 1336 is also coupled via resistor 1340 to node 1343, which is coupled to ground by switch 1344 and coupled to the output of the amplifier 1336 by switch 1342. On the secondary side of transformer 1304, a diode 1310 is coupled in series with an LED 1312.

In operation, the switch 1328 is operated by the signal (D) output from pulse width modulation (PWM) circuit 1316 and the switch 1330 is operated by the signal (1−D) which can be generated by inverting the signal (D), for example (not shown). The voltage generated at node 1329 is low pass filtered by resistor 1332 in capacitor 1334 to generate a signal $K7*D$ which is input to the non-inverting terminal of amplifier 1336. Amplifier 1336, capacitor 1338, resistor 1340 and switches 1342 and 1344 form a division circuit which divides the signal $K7*D$ by (1−D). That signal is applied to the non-inverting input of error amplifier 1318.

Given the fact that this is a buck-boost circuit, utilizing equation 3, we know that:

$$I_{out}*(1-D)=I_{in}$$

Therefore $I_{out}=I_{in}(1-D)/D$ $$I_{in}=K*D(1-D)$$

Thus, if we force:

$$I_{in}=K7*D/(1-D),$$

then;

$$I_{out}=K7*D/(1-D)*(1-D)/D$$

which means that:

$$I_{out}=K7.$$

The signal applied to the non-inverting input of error amplifier 1318 is $K*D/(1-D)$. The signal applied to the inverting input of error amplifier 1318 is related to $I_{in}$. Therefore, the circuit will operate to maintain the output current through the LED 1312 equal to K7 and thus provide a constant current output.

Although the invention has been described in detail, it should be understood that various changes, substitutions and alterations can be made thereto without departing from the spirit and scope of the invention as defined by the appended claims.

The invention claimed is:
1. A method for operating a dimmable LED comprising:
   coupling an LED driver circuit to a rectified output of a dimmer;
   providing a current related to an input voltage of the LED driver circuit;
   multiplying the value of a reference voltage related to a reference current with a pulse width modulation

(PWM) signal having a duty cycle of the LED driver to generate a first voltage, wherein the multiplying includes:
  selectively transferring the reference voltage to a multiplication output node based on the PWM signal;
  selectively transferring a ground voltage to the multiplication output node based on an inverted version of the PWM signal; and
  outputting the first voltage at the multiplication output node;
comparing the first voltage with a second voltage representative of the current through a switch in the LED driver circuit to generate a comparison signal;
using the comparison signal to generate the PWM signal having the duty cycle for controlling the switch and the multiplying.

2. The method of claim 1, further comprising:
interposing a resistive shunt between the switch and a ground voltage for providing the second voltage representative of the current through the switch in the LED driver circuit.

3. The method of claim 1, wherein the controlling the switch in the LED driver circuit includes delivering the PWM signal to a control terminal of the switch.

4. The method of claim 1, wherein the controlling the multiplying includes delivering the PWM signal to an input of an analog multiplier.

5. The method of claim 1, further comprising:
providing a diode having a cathode coupled to the input voltage, and an anode coupled to the switch of the LED driver circuit.

* * * * *